(12) United States Patent
Ebbinghaus et al.

(10) Patent No.: US 11,290,101 B2
(45) Date of Patent: Mar. 29, 2022

(54) SOLID STATE POWER SWITCH DEVICE

(71) Applicant: Aptiv Technologies Limited, St. Michael (BB)

(72) Inventors: Peter P. Ebbinghaus, Ennepetal (DE); Detlef Boll, Bochum (DE); Emmanuel Boudoux, Cologne (DE); Sebastian Yousef, Bochum (DE)

(73) Assignee: Aptiv Technologies Limited, St. Michael (BB)

( * ) Notice: Subject to any disclaimer, the term of this patent is extended or adjusted under 35 U.S.C. 154(b) by 222 days.

(21) Appl. No.: 16/560,068

(22) Filed: Sep. 4, 2019

(65) Prior Publication Data

US 2020/0099374 A1 Mar. 26, 2020

(30) Foreign Application Priority Data

Sep. 26, 2018 (EP) .................................. 18196790

(51) Int. Cl.

| | | |
|---|---|---|
| *G01R 31/08* | (2020.01) | |
| *H03K 17/082* | (2006.01) | |
| *G01R 31/26* | (2020.01) | |
| *G01R 31/27* | (2006.01) | |
| *H03K 17/08* | (2006.01) | |

(52) U.S. Cl.
CPC ..... *H03K 17/0822* (2013.01); *G01R 31/2621* (2013.01); *G01R 31/27* (2013.01); *H03K 2017/0806* (2013.01)

(58) Field of Classification Search
CPC .. G01R 31/006; G01R 31/27; G01R 31/2621; G01R 31/3277; G01R 31/3278; G01R 19/165; G01R 19/16519; G01R 19/16571; H03K 17/12; H03K 17/18; H03K 17/56; H03K 17/60; H03K 17/687; H03K 17/0822; H02J 4/00
See application file for complete search history.

(56) References Cited

U.S. PATENT DOCUMENTS

| | | | | |
|---|---|---|---|---|
| 6,744,260 B2 * | 6/2004 | Schmalz | ............ | G01R 31/3277 324/424 |
| 9,465,075 B2 * | 10/2016 | Edwards | ............ | G01R 31/3277 |
| 10,101,395 B2 * | 10/2018 | Edwards | ............ | G01R 31/3277 |
| 2009/0080130 A1 * | 3/2009 | Hein | ...................... | H02H 3/087 361/72 |

(Continued)

FOREIGN PATENT DOCUMENTS

| | | |
|---|---|---|
| EP | 2 166 365 A1 | 3/2010 |
| EP | 2 720 053 A2 | 4/2014 |

(Continued)

*Primary Examiner* — Alvaro E Fortich
(74) *Attorney, Agent, or Firm* — Sawtooth Patent Group PLLC

(57) ABSTRACT

A solid state power switch device comprises a switch unit comprising at least one switch element configured to provide power supply to a load of a vehicle while the switch element is in close state; a switch control unit in communication with the switch unit, and configured to control in open/close state the switch element; the switch control unit comprising a built in self-test module of the switch element configured to control a self-test sequence of the switch element and to check failure/success of the self-test sequence of the switch element such that the switch unit is self-tested.

25 Claims, 3 Drawing Sheets

(56) References Cited

U.S. PATENT DOCUMENTS

| | | | |
|---|---|---|---|
| 2009/0212975 A1* | 8/2009 | Ausman | H03K 17/18 |
| | | | 340/945 |
| 2013/0154717 A1* | 6/2013 | Tyler | G01R 31/3277 |
| | | | 327/432 |
| 2016/0105054 A1* | 4/2016 | Horito | H01M 10/4257 |
| | | | 320/134 |
| 2019/0187772 A1 | 6/2019 | Boudoux | |

FOREIGN PATENT DOCUMENTS

| | | |
|---|---|---|
| EP | 3 324 196 A1 | 5/2018 |
| GB | 2 486 493 A | 6/2012 |

* cited by examiner

SOLID STATE POWER SWITCH DEVICE

CROSS-REFERENCE TO RELATED APPLICATION

This application claims the benefit under 35 U.S.C. § 119(a) of European Patent Application EP 18196790.2, filed Sep. 26, 2018, the entire disclosure of which is hereby incorporated herein by reference.

TECHNICAL FIELD OF INVENTION

The invention relates to a solid state power switch device and more particularly to a solid state power switch device comprising a built in self-test module of the switch element of the solid state power switch device and a method for self-testing the solid state power switch device.

BACKGROUND OF DISCLOSURE

Solid state power switch device are well known by the person skilled in the art. More particularly, smart power switches for providing power supply to loads of a vehicle generally comprises protection against failure of the loads such as short-circuit. With the advance of autonomous driving, the need for safer and more reliable electronic components increases. The power management poses a great risk since all peripheral components such as radars, Lidar, or cameras are depended on it to a great extent.

Existing smart power switches generally rely on the behavior of their switches' element that plays a role of a smart fuse when overload or short circuit appears on the load of the vehicle. Failure of the smart power switches may cause troubles that are not in line with the level of reliability required by the enhanced autonomous driving vehicles. It is therefore important to propose a new solution to solve these problems.

SUMMARY OF THE INVENTION

According to the invention, a solid state power switch device comprises a switch unit comprising at least one switch element configured to provide power supply to a load of a vehicle while the switch element is in close state; a switch control unit in communication with the switch unit, and configured to control in open/close state the switch element. The switch control unit comprises a built in self-test module of the switch element configured to control a self-test sequence of the switch element and to check failure/success of the self-test sequence of the switch element such that the switch unit is self-tested.

The built in self-test module may comprise the self-test sequence configured to control a close/open/close state sequence of the switch element, and to check failure/success of the close/open/close state of the switch element during the close/open/close sequence.

The solid state power switch device may comprise a diagnostic unit in communication with the switch control unit and configured to report failure/success of the self-test sequence of the switch element.

The switch control unit further may comprise a current measurement module configured to measure a switch signal value representative of the amplitude of the current passing through the switch element; a reference signal module cooperating with the built in self-test module, and configured to provide a self-test signal threshold value lower than a typical switch signal value representative of the amplitude value of the typical current drawn by the load of the vehicle; and a comparator module configured to compare the switch signal value with the self-test signal threshold value, and configured to enable the control of the switch element in open state of the self-test sequence when the switch signal value is greater than the self-test signal threshold value.

The reference signal module may be further configured to provide an overload signal threshold value greater than the typical switch signal value; and the comparator module may be further configured to compare the switch signal value with the overload signal threshold value, and may be configured to enable the control of the switch element in open state when the switch signal value is greater than the overload signal threshold value such that the switch unit is protected against overload.

The switch control unit may comprise a latching mechanism configured to remain the switch element open when the switch signal value is greater than the overload signal threshold value.

The reference signal module may comprise a reference voltage providing the overload signal threshold value, and may comprise a voltage divider of the reference voltage configured to be activated by the built in self-test module for setting up the self-test signal threshold value.

According to the invention, a method for self-testing the solid state power switch device as described above comprises the steps of: controlling a self-test sequence of a switch element of the solid state power switch device and checking failure/success of the self-test sequence of the switch element.

The step of controlling a self-test sequence may comprise a step of controlling a close/open/close state sequence of the switch element; and the step of checking failure/success of the self-test sequence may comprise a step of checking failure/success of the close/open/close state of the switch element during the close/open/close sequence.

The step of controlling a close/open/close state sequence of the switch element may comprise the steps of: measuring a switch signal value representative to the amplitude of the current passing through the switch element; providing a self-test signal threshold value lower than a typical switch signal value representative of the amplitude value of the typical current drawn by the load of the vehicle; and comparing the switch signal value with the self-test signal threshold value; wherein the step of controlling a self-test sequence of a switch element comprises a step of enabling the control of the switch element in open state when the switch signal value is greater than the self-test signal threshold value.

The step of providing a self-test signal threshold value may comprise the steps of: providing a reference voltage value as an overload signal threshold value greater than the typical switch signal value; dividing the reference voltage value; and providing the self-test signal threshold value as a result of dividing the reference voltage value.

The method may further comprise a step of reporting failure/success of the self-test sequence of the switch element.

BRIEF DESCRIPTION OF DRAWINGS

Other features, objects and advantages of the invention will become apparent from reading the detailed description that follows, and the attached drawings, given by way of example and in which.

DETAILED DESCRIPTION

Figure 1:
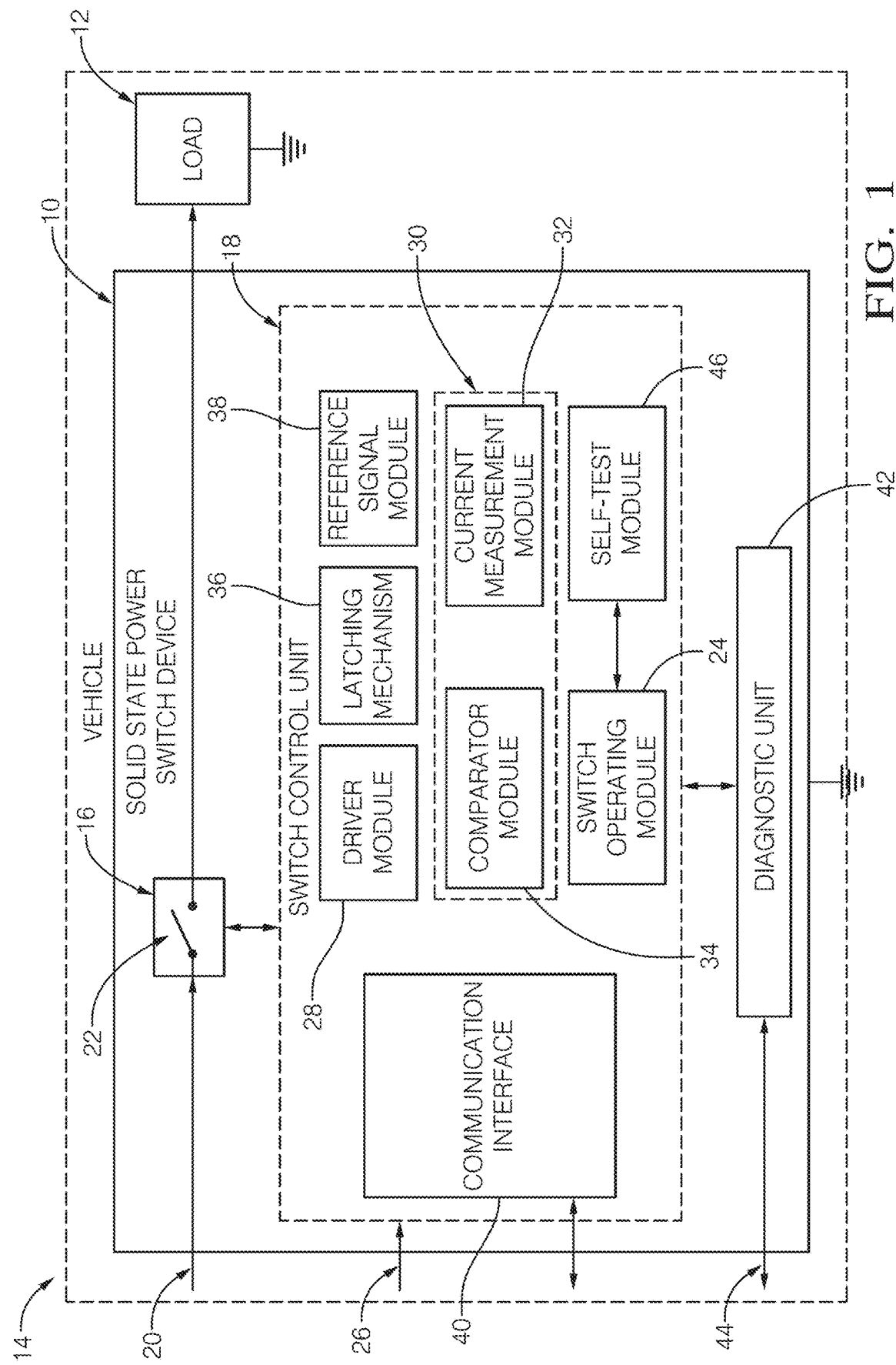
FIG. 1 is a schematic block diagram of the solid state power switch device according to the invention.

According to FIG. 1 a solid state power switch device 10 for supplying loads 12 of a vehicle 14 is illustrated. The solid state power switch device 10 comprises a switch unit 16 and a switch control unit 18 configured to control open state and close state of the switch unit 16. According with one embodiment, the solid state power switch device 10 comprises a switch input voltage 20 supplied by a main power source (not represented) as the battery of the vehicle 14. The solid state power switch device 10 is configured to supply the load 12 by the switch input voltage 20. As an option, a plurality of input voltage may supplied the power switch device, as for example, two input voltages, may supply the power switch device such that redundancy of power supply provide a higher level of functional safety of the power switch device behavior.

The switch unit 16 comprises a switch element 22 such that when the switch element 22 is in open state, the load 12 is not supplied by any source of power, and when the switch element 22 is in close state, the load 12 is supplied by the main power source. The switch element 22 is generally a Metal-Oxide Semiconductor Field-Effect Transistor (MOSFET) wherein the gate of the MOSFET is the control pin and the drain and the source are respectively the input pin and the output pin such that in close state a current flows from the source pin to the drain pin, or vice versa, depending on the type of MOSFET i.e. n-channel MOSFET or p-channel MOSFET.

The switch 16 unit may comprise a plurality of switch elements 22. As non-limitative example, it may comprise two switches element in series such that when one switch element has a short circuit in failure state, the other switch element may be still controlled by the switch control unit 18. The switch unit 16 may also comprise switches element in parallel such that it may support high current distribution to the loads 12 of the vehicle 14.

For easiest description, the invention is described with one switch element 22, wherein the invention may also fit with switch unit 16 comprises a plurality of switch elements in series and or in parallel.

The switch control unit 18 comprises a switch operating module 24 that is enabled under an ignition signal 26. When enabled, the switch operating module 24 sends a command to a driver module 28 for controlling the switch element 22 in close state in order to provide supply the load 12 of the vehicle 14. When disabled, i.e. in absence of an ignition signal 26, the switch element 22 is in open state.

According to one embodiment, the switch control unit 18 comprises an overload detection module 30 configured to detect when the load 12 is in a failure mode such that said load 12 draws much more current (overcurrent situation) than expected from the switch element 22 in close state. In other words, the overload detection module 30 is configured to detect when the amplitude of the current drawn by the load 12 is greater than the amplitude value of a typical current drawn by the load 12 of the vehicle 14. A typical current drawn by a load 12 is the expected current that a load 12 may draw according to its impedance in a non-failure mode and its supply voltage, in that case the main power source voltage.

The overload detection module 30 is configured to inform the switch operating module 24 that failure occurs on the load 12. The overload detection module 30 sends a command to the driver module 28 for controlling the switch element 22 in open state and it informs the switch operating module 24 about the command to get the switch element 22 in open state. Generally, the overload failure of the load 12 is a short-circuit of the load 12.

More particularly, the overload detection module 30 comprises a current measurement module 32 configured to measure a switch signal value representative of the amplitude of the current passing through the switch element 22.

The overload detection module 30 further comprises a comparator module 34, wherein the switch signal value is compared with an overload signal threshold value greater than the typical switch signal value representative of the amplitude value of the typical current drawn by the load 12 of the vehicle 14. When the switch signal value is greater than the overload signal threshold value, the comparator module 34 trigs the driver module 28 such that said driver module 28 controls the switch element 22 in open mode. In such case, in order to guarantee that the switch element 22 remains open, the driver module 28 cooperates with a latching mechanism 36 which makes sure that the switch is latched and can no longer operate in close state mode until it is actively reset.

The switch control unit 18 comprises a reference signal module 38 that established a reference voltage from the main power source voltage. The reference voltage provides the overload signal threshold value.

Other kind of overload detection module 30 may be implemented, as for example, a temperature detection of the switch element 22 may also indicate a possible overload failure on the load 12 of the vehicle 14, especially when temperature rises abnormally.

In one embodiment, the solid state power switch device 10 comprises a communication interface 40 such as a Serial Peripheral Interface (SPI) in order for an external operator to set up the reference voltage of the reference signal module 38 according to the load 12 characteristic to be driven by the solid state power switch device 10.

The solid state power switch device 10 comprises a diagnostic unit 42 in communication with the switch control unit 18. The diagnostic unit 42 is configured to report overload detection of the load 12 of the vehicle 14 powered by the solid state power switch device 10. The reporting of information from the diagnostic unit 42, such as overload detection, consists on providing that information available on an output line 44 of the solid state power switch device 10, such as being available for other devices of the vehicle 14.

According to FIG. 1, the switch control unit 18 further comprises a built in self-test module 46 that is configured to evaluate the state of health of the switch unit 16. In other words, the built in self-test module 46 provide an auto diagnostic of the switch unit 16 such that it is able to detect a failure behavior or a success behavior of the switch element 22 of the switch unit 16. After an operation of the built in self-test module 46, the diagnostic unit 42 is reporting the result of the behavior test of the switch element 22 of the switch unit 16, i.e. a failure or a success behavior.

The built in self-test module 46 comprises all the logic circuitry to control a test and an evaluation of the behavior of the switch element 22. The built in self-test module 46 of the switch element 22 is configured to control a self-test sequence of the switch element 22 and to check failure/success of the self-test sequence of the switch element 22 such that the switch unit 16 is self-tested. According to one embodiment, the self-test sequence operates a close/open/close state control sequence of the switch element 22, and operates a failure/success check of the close/open/close state control sequence of the switch element 22 during the close/open/close sequence.

Figure 2:
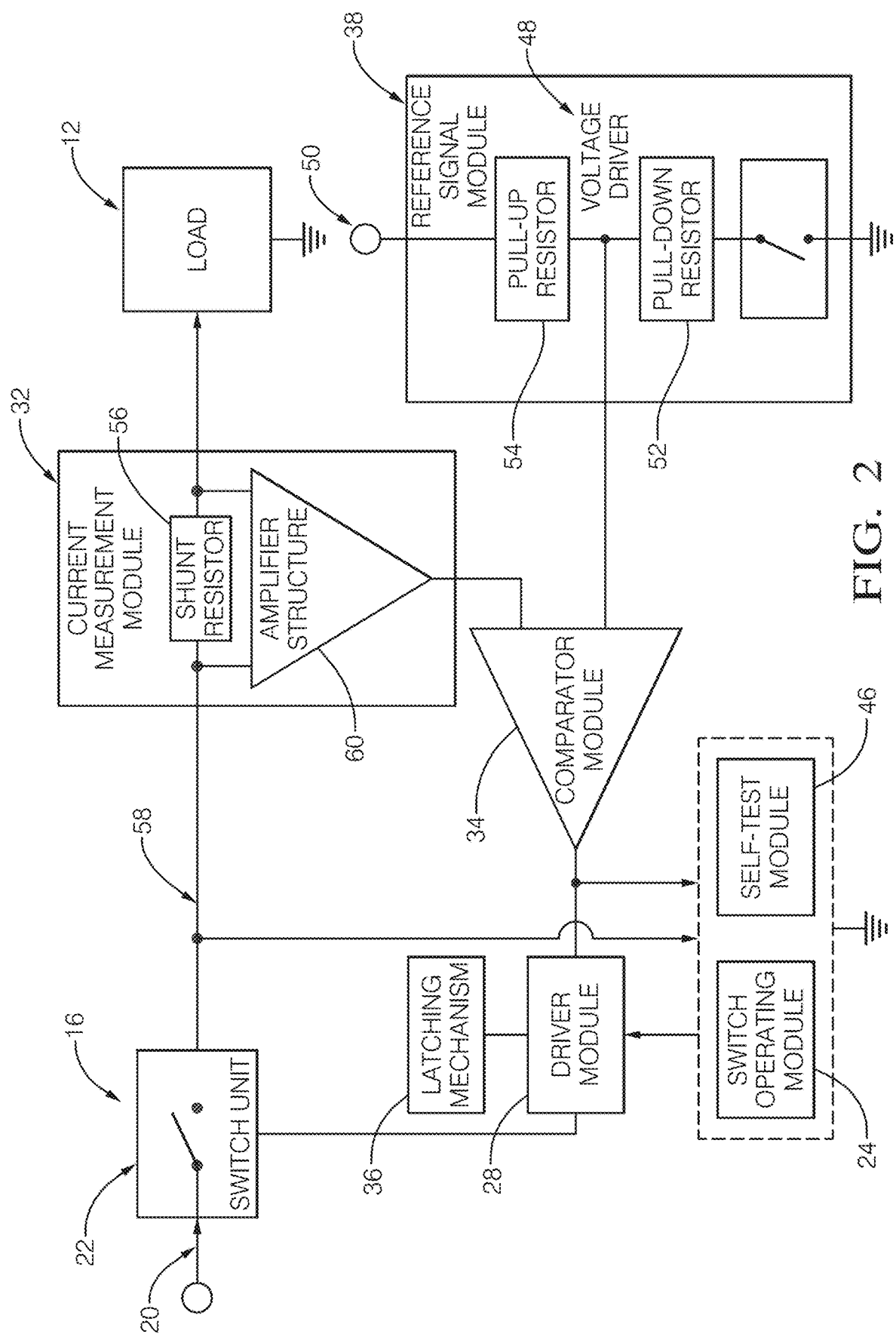
FIG. 2 is a schematic block diagram of one details embodiment of the solid state power switch device of FIG. 1.

According to FIG. 2, details of an embodiment of the solid state power switch device 10 is illustrated such that the operation mechanism of the built in self-test module 46 may be clearly described.

The reference signal module 38 is in communication with the built in self-test module 46. More particularly, the built in self-test module 46 cooperates with the reference signal module 38 in order to provide a self-test signal threshold value to the comparator module 34.

The reference signal module 38 comprises a voltage divider 48 as a voltage divider bridge. The self-test signal threshold value is providing when the voltage divider 48 of the reference voltage 50 is enabled. Activation of the voltage divider 48 comprises a grounding of the pull down resistor 52 of a voltage divider bridge. When the pull down resistor 52 is grounding, the self-test signal threshold value is the voltage value measured between the pull-up resistor 54 of the voltage divider bridge and the pull down resistor 52. The self-test signal threshold value is the result of a division of the reference voltage 50 according to the pull up resistor 54 and the pull down resistor 52. The self-test signal threshold value is lower than the typical switch signal value representative of the amplitude value of the typical current drawn by the load 12 of the vehicle 14.

The overload signal threshold value is providing when the voltage divider 48 of the reference voltage 50 is disabled. In other words, the overload signal threshold value is the voltage value measured between the pull-up resistor 54 of the voltage divider bridge and the pull down 52 resistor when the pull down resistor 52 is not grounding such that no current is flowing through the pull down resistor, i.e. no dividing operation of the reference voltage 50 is operating. In the illustrated embodiment, the overload signal threshold value is equal to the reference voltage 50 value as being not divided.

The current measurement module 32 comprises a shunt resistor 56 of few milliohm value connected in series between the output 58 of the switch unit 16 and the load 12 of the vehicle 14 such that the current passing through the switch element 22, i.e. the current drawn by the load 12 of the vehicle 14 is also passing through the shunt resistor 56. A differential measurement of the voltage across the shunt resistor 56 is done by an amplifier structure 60. The output of the amplifier structure 60 provides a switch signal voltage value representative of the amplitude of the current passing through the switch element 22.

The switch signal voltage value is used as input signal for the comparator module 34 such that the switch signal voltage value is then compared either with the overload signal threshold value or with the self-test signal threshold value. When the switch signal voltage value is greater than either the overload signal threshold value or with the self-test signal threshold value, the comparator output trigs the driver module 28 such that the driver module 28 controls the switch element 22 in open state.

The built in self-test module 46 is also in communication with the output 58 of the switch unit 16 such that the built in self-test module 46 is able to get a status on the state of the switch.

According to FIG. 1 and FIG. 2, the detail mechanism of the built in self-test sequence of the switch element 22 comprises a step of detecting the presence of the ignition signal 26 by the built in self-test module 46 while the voltage divider is disabled. At this stage, the built in self-test module 46 should detect an open state of the switch element 22. If the switch element 22 is in close state, the built in self-test module 46 provides failure information to the diagnostic unit 42. If the switch element 22 is detected as being in open state, the built in self-test module 46 sends a command to the driver module 28 for controlling the switch element 22 in close state. The built in self-test module 46 checks that the switch element 22 is in close state.

Directly following said step, the built in self-test module 46 is enabling the voltage divider 48 such that the self-test signal threshold value is used as a threshold value for the comparator module 34. The amplitude value of the typical current drawn by the load 12 is then compared with the self-test threshold value, said self-test threshold value being set lower than said typical current amplitude value. Thus, as a result of the comparison, the comparator module 34 output triggers the driver module 28 such that the switch element 22 toggles in the open state. The built in self-test module 46 checks that the switch element 22 is in open state.

Following said step, the built in self-test module 46 disable the voltage divider 48 such that the overload signal threshold value is used as a threshold value for the comparator module 34. The comparator module 34 sends a command to the driver module 28 for controlling the switch element 22 in close state. The switch element 22 toggles in close state and remains in close state. The built in self-test module 46 checks that the switch element 22 is in close state.

In case of failure of any one of the steps of the self-test sequence of the switch element 22, the diagnostic unit 42 in communication with the built in self-test module 46 reports a failure of the self-test sequence of the switch element 22. In case of success of all the steps of the self-test sequence of the switch element 22, the diagnostic unit 42 reports a success of the self-test sequence of the switch element 22.

Figure 3:
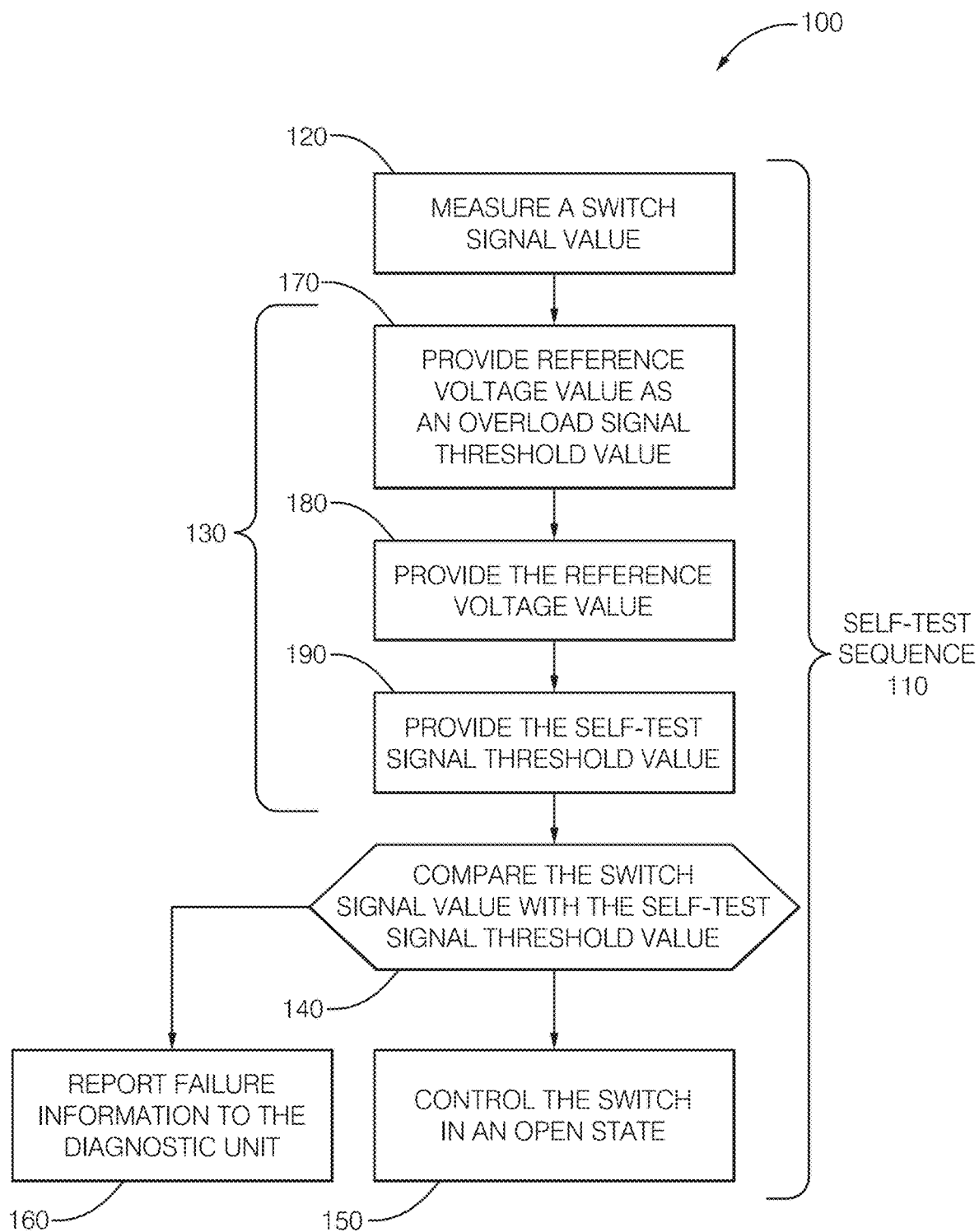
FIG. 3 is a schematic flow chart of a method for self-testing the solid state power switch device of FIG. 1.

According to FIG. 3, a method 100 for self-testing the solid state power switch device 10 as described on FIG. 1 and FIG. 2 comprises a step of controlling the self-test sequence 110 of the switch element 22 of the solid state power switch device 10 and in the main time a step of checking failure/success of the self-test sequence of the switch element 22. Said two steps are processed by the built in self-test module 46.

More particularly, the step of controlling the self-test sequence 110 comprises a step of controlling a close/open/close state sequence of the switch element 22 and the step of checking failure/success of the self-test sequence comprises a step of checking failure/success of the close/open/close state of the switch element 22 during the close/open/close sequence.

The step of controlling a close/open/close state sequence of the switch element 22 comprises a step of measuring 120 a switch signal value representative to the amplitude of the current passing through the switch element 22 by the current measurement module 32, and providing to the comparator module 34 a self-test signal threshold value 130 lower than a typical switch signal value representative of the amplitude value of the typical current drawn by the load 12 of the vehicle 14. Then it further comprises a step of comparing 140 by the comparator module 34 the switch signal value with the self-test signal threshold value such that the step of controlling a self-test sequence of a switch element 22 comprises a step of enabling the control of the switch element 22 in open state when the switch signal value is greater than the self-test signal threshold value. Otherwise, if the switch signal value is lower than the self-test signal threshold value, then the built in self-test module 46 reports 160 failure information to the diagnostic unit 42.

The step of providing the self-test signal threshold value 130 to the comparator module 34 comprises a step of providing a reference voltage value 170 as an overload signal threshold value greater than the typical switch signal value; then it further comprises a step of dividing 180 the reference voltage value for providing 190 the self-test signal threshold value as a result of dividing the reference voltage 50 value by the voltage divider bridge.

We claim:

1. A solid state power switch device, comprising:
   a switch unit comprising at least one switch element configured to provide power supply to a load of a vehicle while the switch element is in a close state;
   a switch control unit in communication with the switch unit, the switch control unit configured to control the switch element to be in an open state or a closed state and to execute a built in self-test module configured to control a self-test sequence of the switch element, the self-test sequence comprising:
      performing comparisons between a current at the switch element and one or more test currents that trigger state changes of the switching element, the one or more test currents including a self-test signal threshold current or an overload signal threshold current; and
      checking whether the comparisons and the state changes of the switching element indicate that the self-test sequence of the switch element is a failure or a success.

2. The solid state power switch device according to claim 1, wherein the built in self-test module comprises the self-test sequence configured to:
   control, based on the comparison between the current at the switch element and the one or more test currents, a close/open/close state sequence of the switch element; and
   check whether the comparisons and the state changes of the switching element indicate that the close/open/close state sequence of the switch element is a failure or success.

3. The solid state power switch device according to claim 1, further comprising a diagnostic unit in communication with the switch control unit and configured to report whether the comparisons and the state changes of the switching element indicate that the self-test sequence of the switch element is a failure or a success.

4. The solid state power switch device according to claim 1, wherein the switch control unit further comprises a current measurement module configured to measure a switch signal value representative of an amplitude of a current passing through the switch element.

5. The solid state power switch device according to claim 4, wherein the switch control unit further comprises a reference signal module cooperating with the built in self-test module, and configured to provide the self-test signal threshold value lower than a typical switch signal value representative of the amplitude value of a typical current drawn by the load of the vehicle.

6. The solid state power switch device according to claim 5, wherein the switch control unit further comprises a comparator module configured to compare the switch signal value with the self-test signal threshold value.

7. The solid state power switch device according to claim 6, wherein the comparator module is further configured to enable the control of the switch element in open state of the self-test sequence when the switch signal value is greater than the self-test signal threshold value.

8. The solid state power switch device according to claim 6, wherein the reference signal module is further configured to provide the overload signal threshold value greater than the typical switch signal value; and
   the comparator module is further configured to compare the switch signal value with the overload signal threshold value, and configured to enable the control of the switch element in open state when the switch signal value is greater than the overload signal threshold value such that the switch unit is protected against overload.

9. The solid state power switch device according to claim 8, wherein the switch control unit comprises a latching mechanism configured to remain the switch element in open state when the switch signal value is greater than the overload signal threshold value.

10. The solid state power switch device according to claim 8, wherein the reference signal module comprises a reference voltage providing the overload signal threshold value, and comprises a voltage divider of the reference voltage configured to be enabled by the built in self-test module for setting up the self-test signal threshold value.

11. A method for self-testing a solid state power switch device, the method comprising:
    performing a self-test sequence of a switch element including comparisons between a current at the switch element and one or more test currents that trigger state changes of the switching element, the one or more test currents including a self-test signal threshold current or an overload signal threshold current; and
    checking whether the comparisons and the state changes of the switching element indicate that the self-test sequence of the switch element is a failure or a success.

12. The method according to claim 11, wherein the state changes of the switching element comprise a close/open/close state sequence of the switch element, and checking whether the comparisons and the state changes of the switching element indicate that the self-test sequence of the switch element is a failure or a success comprises:
    checking whether the comparisons and the state changes of the switching element indicate that the close/open/close state sequence of the switch element is a failure or success.

13. The method according to claim 12, wherein performing the comparisons between the current at the switch element and the one or more currents comprises:
    measuring a switch signal value representative to an amplitude of a current passing through the switch element;
    providing the self-test signal threshold value lower than a typical switch signal value representative of the amplitude value of a typical current drawn by a load of a vehicle;
    comparing the switch signal value with the self-test signal threshold value; and
    enabling control of the switch element in an open state when the switch signal value is greater than the self-test signal threshold value.

14. The method according to claim 13, wherein providing the self-test signal threshold value comprises:
    providing a reference voltage value as an overload signal threshold value greater than the typical switch signal value;
    dividing the reference voltage value; and providing the self-test signal threshold value as a result of dividing the reference voltage value.

15. The method according to claim 11, wherein the method further comprises:
reporting whether the comparisons and the state changes of the switching element indicate that the self-test sequence of the switch element is a failure or a success.

16. A method of operating a solid state power switch device, the method comprising:
providing a power supply to a load of a vehicle, with a switch unit comprising at least one switch element, and while the switch element is in a close state;
controlling, with a switch control unit in communication with the switch unit, the switch element in an open/close state;
performing comparisons between a current at the switch element and one or more test currents that trigger state changes of the switching element, the one or more test currents including a self-test signal threshold current or an overload signal threshold current;
performing, with a self-test module of the switch element, a self-test sequence of the switch element comprising comparisons between a current at the switch element and one or more test currents that trigger state changes of the switching element, the one or more test currents including a self-test signal threshold current or an overload signal threshold current; and
checking, with the self-test module, whether the comparisons and the state changes of the switching element indicate that the self-test sequence of the switch element is a failure or a success.

17. The method according to claim 16, wherein performing the self-test sequence comprises:
controlling, based on the comparisons between the current at the switch element and the one or more currents, a close/open/close state sequence of the switch element; and
checking whether the comparisons and the state changes of the switching element indicate that the close/open/close state sequence of the switch element is a failure or success.

18. The method according to claim 16, further comprising reporting, with a diagnostic unit in communication with the switch control unit, whether the comparisons and the state changes of the switching element indicate that the self-test sequence of the switch element is a failure or a success.

19. The method according to claim 16, further comprising measuring, with a current measurement module of the switch control unit, a switch signal value representative of an amplitude of a current passing through the switch element.

20. The method according to claim 19, further comprising providing, with a reference signal module of the switch control unit, the self-test signal threshold value lower than a typical switch signal value and that is representative of the amplitude value of a typical current drawn by the load of the vehicle.

21. The method according to claim 20, further comprising comparing, with a comparator module of the switch control unit, the switch signal value with the self-test signal threshold value.

22. The method according to claim 21, further comprising controlling, with the comparator module, the switch element in an open state of the self-test sequence when the switch signal value is greater than the self-test signal threshold value.

23. The method according to claim 21, further comprising:
providing, with the reference signal module, an overload signal threshold value greater than the typical switch signal value;
comparing, with the comparator module, the switch signal value with the overload signal threshold value; and
controlling, with the comparator module, the switch element in an open state when the switch signal value is greater than the overload signal threshold value such that the switch unit is protected against overload.

24. The method according to claim 23, further comprising maintaining, with a latching mechanism of the switch control unit, the switch element in an open state when the switch signal value is greater than the overload signal threshold value.

25. The method according to claim 23, further comprising:
providing, with the reference signal module, a reference voltage providing the overload signal threshold value; and
providing the self-test signal threshold value by dividing the reference voltage using a voltage divider.

* * * * *